United States Patent
Lv et al.

(10) Patent No.: US 10,699,658 B2
(45) Date of Patent: Jun. 30, 2020

(54) GOA DRIVE CIRCUIT

(71) Applicant: Shenzhen China Star Optoelectronics Technology Co., Ltd., Shenzhen, Guangdong (CN)

(72) Inventors: Xiaowen Lv, Guangdong (CN); Congwei Liao, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 439 days.

(21) Appl. No.: 15/539,738

(22) PCT Filed: May 8, 2017

(86) PCT No.: PCT/CN2017/083451
§ 371 (c)(1),
(2) Date: Jun. 26, 2017

(87) PCT Pub. No.: WO2018/176577
PCT Pub. Date: Oct. 4, 2018

(65) Prior Publication Data
US 2020/0013361 A1 Jan. 9, 2020

(30) Foreign Application Priority Data
Mar. 31, 2017 (CN) .......................... 2017 1 0206223

(51) Int. Cl.
*G09G 3/36* (2006.01)

(52) U.S. Cl.
CPC ... *G09G 3/3677* (2013.01); *G09G 2300/0408* (2013.01); *G09G 2310/08* (2013.01); *G09G 2320/043* (2013.01); *G09G 2330/08* (2013.01)

(58) Field of Classification Search
CPC ........... G11C 19/28; G09G 2310/0286; G09G 2310/0267; G09G 2300/0871; G09G 3/3677; G09G 2330/08; G09G 2300/0408
See application file for complete search history.

(56) References Cited

U.S. PATENT DOCUMENTS

| | | |
|---|---|---|
| 2013/0057565 A1 | 3/2013 | Choi et al. |
| 2013/0148050 A1 | 6/2013 | Kwon et al. |
| 2017/0358261 A1* | 12/2017 | Zhou ................... G09G 3/3258 |
| 2018/0122322 A1* | 5/2018 | Ji ......................... G09G 3/3677 |
| 2018/0197485 A1* | 7/2018 | Jose ..................... G09G 3/3291 |
| 2018/0308409 A1* | 10/2018 | Park ........................ G09G 3/20 |
| 2018/0330687 A1 | 11/2018 | Zeng |
| 2018/0336837 A1 | 11/2018 | Chen |

FOREIGN PATENT DOCUMENTS

CN 106251823 A 12/2016

* cited by examiner

*Primary Examiner* — Abbas I Abdulselam

(57) ABSTRACT

A GOA drive circuit includes a multiple stage of GOA drive units. A GOA drive unit includes a pre-pulldown unit which is configured to disconnect a discharge path of a first voltage signal via the pull-down sustaining unit before the first voltage signal jumps from a low electric potential to a high electric potential. In the GOA drive circuit, the voltage stability of the key nodes in a circuit and the reliability of the timing can be ensured; overall performance of the GOA drive circuit can be improved; and a service life of a display device can be prolonged.

13 Claims, 2 Drawing Sheets

GOA DRIVE CIRCUIT

CROSS-REFERENCE TO RELATED APPLICATIONS

This application claims the priority of Chinese patent application CN 201710206223.7, entitled "GOA Drive Circuit" and filed on Mar. 31, 2017, the entirety of which is incorporated herein by reference.

FIELD OF THE INVENTION

The present disclosure relates to the technical field of display, and in particular, to a GOA drive circuit.

BACKGROUND OF THE INVENTION

With the development of liquid crystal display technology and the improvement of thin film transistor (TFT) performance, GOA (Gate On Array) drive circuits have been increasingly widely used in liquid crystal display (LCD) devices.

A GOA drive circuit has many advantages. For example, since the GOA drive circuit is formed on an array substrate directly, using amount of a gate integrated circuit (Gate IC) chip can be saved, and design of a frameless display screen can be realized. Moreover, when the GOA drive circuit is used, a qualified rate of the display screen can be improved, and a production cost thereof can be reduced.

However, since the GOA drive circuit is directly arranged on the array substrate, it is not convenient to replace the components thereof. The increase of electric potential drift of the components and electric leakage may cause voltage changes of some key nodes in the circuit, and even may lead to operation timing errors of the GOA drive circuit and display fault.

SUMMARY OF THE INVENTION

One of the technical problems to be solved by the present disclosure is to provide a GOA drive circuit which can maintain stable node voltages and has reliable operation timing.

In order to solve the abovementioned technical problem, the present disclosure first provides a GOA drive circuit. The GOA drive circuit comprises multiple stages of GOA drive units. A GOA drive unit in each stage is used for outputting a row scan signal to a row of pixel units. The GOA drive unit further comprises a pull-up unit, a pull-up control unit, a transmission unit, a pull-down unit, and a pull-down sustaining unit. The pull-up control unit outputs a first voltage signal. The GOA drive unit further comprises a pre-pulldown unit, which is configured to disconnect a discharge path of the first voltage signal via the pull-down sustaining unit before the first voltage signal jumps from a low electric potential to a high electric potential.

Preferably, the pull-down sustaining unit includes a first transistor, with a gate thereof being connected with the first voltage signal, a source thereof being connected with a first power signal, and a drain thereof outputting a second voltage signal which is configured to connect or disconnect the path.

Preferably, the pre-pulldown unit includes a second transistor, with a source thereof being connected with the first power signal, a drain thereof being connected with the second voltage signal, and a gate thereof being connected with a pre-pulldown signal. A rising edge of the pre-pulldown signal goes ahead of a rising edge of the first voltage signal, and a falling edge of the pre-pulldown signal goes ahead of a falling edge of the first voltage signal while lags behind the rising edge of the first voltage signal.

Preferably, in a previous stage of GOA drive unit in cascade connection with a present stage of GOA drive unit, the transmission unit outputs a first transmission signal which serves as the pre-pulldown signal.

Preferably, in a further previous stage of GOA drive unit of a previous stage of GOA drive unit which is in cascade connection with a present stage of GOA drive unit, the transmission unit outputs a second transmission signal which serves as the pre-pulldown signal.

Preferably, the pull-up control unit includes a third transistor, with a gate thereof being connected with the first transmission signal output by the transmission unit of the previous stage of GOA drive unit in cascade connection with the present stage of GOA drive unit, a source thereof being connected with the first voltage signal, and a drain thereof being connected with a second power signal.

Preferably, the pull-down sustaining unit further includes a fourth transistor, with a source thereof being connected with the second voltage signal, a source thereof being connected with the first power signal, and a drain thereof being connected with the first voltage signal; a fifth transistor, with a gate and a source thereof respectively connected to the gate and the source of the fourth transistor, and a drain thereof being connected with a row scan signal corresponding to a GOA drive unit to which the fifth transistor belongs; and a sixth transistor, with a gate and a drain thereof being both connected with a third power signal, and a source thereof being connected with the second voltage signal.

Preferably, the transmission unit includes a seventh transistor, a gate thereof being connected with the first voltage signal, a drain thereof being connected with a clock signal, and a source thereof outputting a third transmission signal.

Preferably, the pull-up unit includes an eighth transistor and a bootstrap capacitor. A gate of the eighth transistor is connected with the first voltage signal; a drain thereof is connected with a clock signal; and a source thereof outputs a row scan signal corresponding to a GOA drive unit to which the eighth transistor belongs. The bootstrap capacitor is connected in parallel between the gate and the source of the eighth transistor.

Preferably, the pull-down unit includes a ninth transistor and a tenth transistor. A gate and a source of the ninth transistor are respectively connected with a gate and a source of the tenth transistor. A drain of the ninth transistor is connected with the first voltage signal, and a drain of the tenth transistor is connected with a row scan signal corresponding to a GOA drive unit to which the tenth transistor belongs.

Compared with the prior art, one or more embodiments of the abovementioned solution may have the following advantages or beneficial effects.

By arranging the pre-pulldown unit in the GOA drive unit in each stage, the discharge path of the voltage at point Q is disconnected before the voltage at point Q jumps from a low electric potential to a high electric potential, thus ensuring stability of the critical node voltages in the circuit as well as the reliability of operation timing and enhancing the GOA drive circuit overall performance. In this manner, the service life of a liquid crystal display device can be prolonged.

Other advantages, objects, and features of the present disclosure will be further explained in the following description, and to some extent, would be obvious to those skilled in the art based on study of the following description. Or, those skilled in the art may obtain teachings from practice of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of technical solutions the present application or the prior art, and constitute one part of the description. The drawings expressing embodiments of the present application are used for interpreting the technical solutions of the present application together with the embodiments, not for limiting the technical solutions of the present application. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no conflict, all the technical features mentioned in all the embodiments may be combined together in any manner, and the technical solutions obtained in this manner all fall within the scope of the present disclosure.

Figure 1:
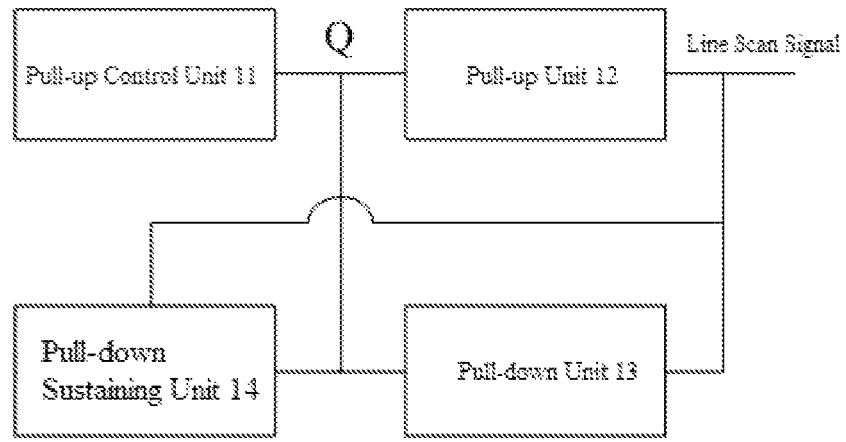
FIG. 1 schematically shows a structure of a GOA drive unit in the prior art.

FIG. 1 schematically shows a structure of a GOA drive unit in the prior art. An actual GOA drive circuit is typically composed of multiple stages of GOA drive units connected with each other as shown in FIG. 1, and a GOA drive unit in one stage is used for outputting a row scan signal to one row of pixel units.

As shown in FIG. 1, the conventional GOA drive circuit generally comprises a pull-up control unit 11, a pull-up unit 12, a pull-down unit 13, and a pull-down sustaining unit 14. The pull-up control unit 11 is connected with the pull-up unit 12 and outputs a control signal to the pull-up unit 12 in a specific timing. Represented by a voltage at point Q in FIG. 1, the control signal is used for turning on the pull-up unit 12 so that the pull-up unit 12 outputs a row scan signal. The pull-down unit 13 is used for pulling down the row scan signal and the voltage at point Q of the present stage of GOA drive unit to a low electric potential. The pull-down sustaining unit 14 is used for maintaining the row scan signal and the voltage at point Q to be at a low electric potential during a non-scan period of a present row of pixel units.

It can be seen that, a value of the voltage at point Q and operation timing thereof are crucial to implementation of a function of the GOA drive circuit. In actual use, when the voltage at point Q jumps from a low electric potential to a high electric potential, the case that the voltage at point Q cannot be boosted would possibly occur.

Figure 2:
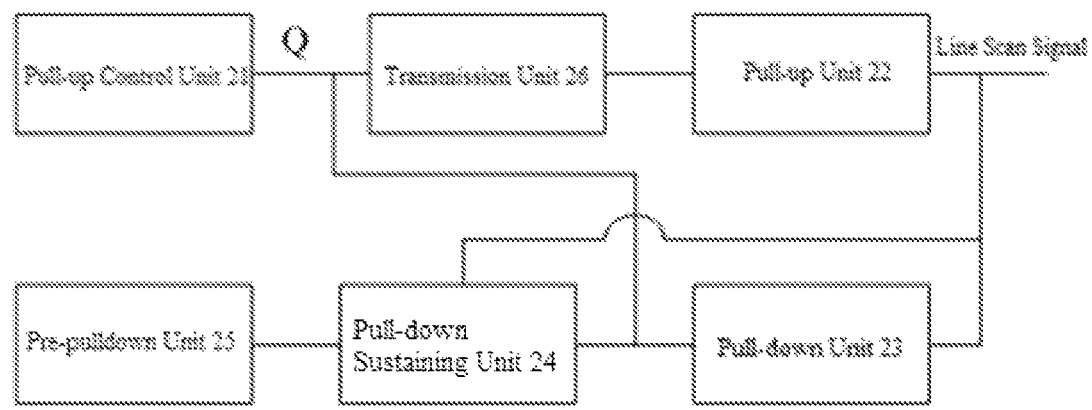
FIG. 2 schematically shows a structure of a GOA drive unit in one stage according to one embodiment of the present disclosure.

In view of the abovementioned technical problem, the present embodiment provides a GOA drive unit, and a structure thereof is shown in FIG. 2. The GOA drive unit according to the embodiment of the present disclosure further comprises a pre-pulldown unit 25 and a transmission unit 26 in addition to a pull-up control unit 21, a pull-up unit 22, a pull-down unit 23, and a pull-down sustaining unit 24.

The pre-pulldown unit 25 is connected with the pull-down sustaining unit 24. The pre-pulldown unit 25 is configured to disconnect a discharge path of the voltage at point Q (the first voltage signal) via the pull-down sustaining unit 24 before the voltage at point Q jumps from a low electric potential to a high electric potential. The present disclosure will be further explained below with reference to another embodiment.

Figure 3:
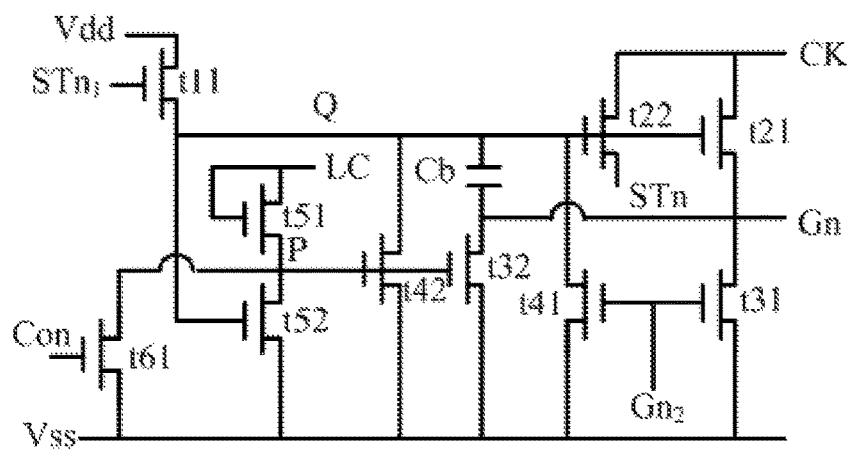
FIG. 3 schematically shows a structure of a GOA drive unit in one stage according to another embodiment of the present disclosure.

FIG. 3 schematically shows a structure of a GOA drive unit in a stage according to another embodiment of the present disclosure. As shown in FIG. 3, a transistor t11 (a third transistor) constitutes a pull-up control unit 21. A gate of the transistor t11 is connected with a transmission signal $STn_1$ ($n_1$ is smaller than n) outputted by a previous stage of GOA drive unit in cascade connection with the present stage of GOA drive unit; a source of t11 is connected with point Q; and a drain of t11 is connected with a constant high voltage signal Vdd (a second power signal). The transmission signal $STn_1$ is generated by a transmission unit 26 of an $n1^{th}$ stage of GOA drive unit.

As shown in FIG. 3, the transmission unit 26 mainly includes a transistor t22 (a seventh transistor). A gate of t22 is connected with point Q; a drain of t22 is connected with a clock signal CK; and a source of t22 outputs a transmission signal STn (a third transmission signal corresponding to the present stage of GOA drive unit). According to the embodiment of the present disclosure, since the transmission unit 26 is arranged, electric leakage of point Q of the present stage of GOA drive unit via the pull-up unit 22 during its voltage maintenance stage can be reduced to a certain extent.

According to the present embodiment, the pull-up unit 22 includes a transistor t21 (an eighth transistor) and a bootstrap capacitor Cb. The bootstrap capacitor Cb is in parallel connection between a gate and a source of t21. A drain of t21 is connected with the clock signal CK; the source of t21 is used as a row scan signal output terminal of the present stage of GOA drive unit to output a corresponding row scan signals Gn; and the gate of t21 is connected with point Q.

According to the present embodiment, the pull-down unit 23 includes a transistor t31 (a tenth transistor) and a transistor t41 (a ninth transistor). A gate and a source of t31 are connected with a gate and a source of t41 respectively. A drain of t31 is connected with a row scan signal of the present stage of GOA drive unit, and can be used for pulling down the corresponding row scan signal. A drain of t41 is also connected with point Q. The gate of t31 and the gate of t41 are controlled by a pull-down signal $Gn_2$ ($Gn_2$ is a row scan signal corresponding to an $n2^{th}$ stage of GOA drive unit, and $n_2$ is larger than n). The source of t31 and the source of t41 are connected with a constant low-level signal Vss.

It can also be seen from the above connection relationship that, point Q is a convergence point of many branches, and therefore the voltage at point Q and the operation timing thereof are crucial to the implementation of the drive function of the circuit.

Further, with reference to the pull-up control unit 21, when $STn_1$ is a high-level signal, the transistor t11 is turned on, and point Q receives the high level of the power supply Vdd and jumps from a low electric potential to a high electric potential.

The source of the transistor t11 is also connected with a gate of a transistor t52 (a first transistor). A source of t52 is connected with a constant low voltage signal Vss (a first power signal), and a voltage signal (a second voltage signal) output by a drain of t52 is represented by a voltage at point P. The drain of t52 is connected with a gate of a transistor t42 (a fourth transistor). A source of t42 is connected with the constant low voltage signal Vss, and a drain of t42 is connected with point Q. When the voltage at point P is a high electric potential, the transistor t42 is turned on and the voltage at point Q will be pulled down from a high electric potential to a low electric potential. That is, point Q will discharge via the transistor t42. When the voltage at point P is a low electric potential, the transistor t42 is turned off and the voltage at point Q can be maintained at a high electric potential. Therefore, the discharge path of point Q can be connected or disconnected through controlling the value of the voltage at point P.

In addition, according to the present embodiment, the pull-down sustaining unit 24 further includes a transistor t32 (a fifth transistor) and a transistor t51 (a sixth transistor) in addition to the transistors t52 and t42. A gate and a source of t32 are respectively connected with the gate and the source of transistor t42, and a drain of t32 is connected with a row scan signal for pulling down the row scan signal to a low electric potential in appropriate timing. A gate and a drain of t51 are both connected with a constant high voltage signal LC (a third power signal). A source of t51 is connected with point P, and t51 can maintain a high electric potential of point P, so that the transistor t42 is maintained in a turned-on state.

According to the embodiment of the present disclosure, the pre-pulldown unit 25 includes a transistor t61 (a second transistor). A gate of t61 is connected with a pre-pulldown signal Con; a source of t61 is connected with a constant low voltage signal Vss; and a drain of t61 is connected with point P to control the voltage at point P. Specifically, when the pre-pulldown signal Con is a high voltage signal, the transistor t61 is turned on and the voltage at point P is pulled down to a low electric potential. In this case, the transistor t42 is turned off. When the pre-pulldown signal Con is a low voltage signal, the transistor t61 is turned off and the voltage at point P jumps to a high electric potential under control of the transistor t51, as shown in FIG. 3.

Further, according to the present disclosure, the pre-pulldown signal Con and the voltage signal Q should satisfy a certain timing relationship. Specifically, a rising edge of Con goes ahead of a rising edge of Q, and a falling edge of Con goes ahead of a falling edge Q while lags behind the rising edge of Q.

Since the rising edge of Con comes ahead of the rising edge of Q, the transistor t61 can be turned on by Con before the voltage at point Q jumps from a low electric potential to a high electric potential, and then the voltage at point P is pulled down to a low electric potential so that the transistor 42 is turned off. That is, the discharge path of point Q is disconnected before point Q jumps from a low electric potential to a high electric potential so that the voltage at point Q can be reliably pulled up. When the voltage at point Q jumps to a high electric potential, the transistor t52 is turned on under the control of the voltage at point Q, and the electric potential of point P can be pulled down by t52.

Since the falling edge of Con is ahead of the falling edge of Q (and at the same time lags behind the rising edge of Q), when the voltage of Con jumps to a low electric potential, the transistor t61 is turned off and no voltage is applied to point P. The voltage at point P is controlled completely by the voltage at point P and the LC.

Since the GOA drive circuit in the prior art is not provided with the transistor t61, the case that the voltage at point Q cannot be boosted would possibly occur. Specifically, as shown in FIG. 3, in an initial period when the voltage at point Q jumps from a low voltage to a high voltage, the transistor t42 is in a turned-on state. Only when the voltage at point Q is in a high electric potential, the transistor t42 is in a turned-off state. If the voltage at point P cannot be pulled down in time, it will lead to electric leakage at point Q in the precharge stage, and thus point Q may not be boosted. That is, there is a competitive relationship between the jump of the voltage at point Q and the jump of the voltage at point P.

Even if points Q and P in the design stage, or an initial stage of use of the product can meet the corresponding timing relationship, with the increase of electric potential drift of the components and electric leakage, the reliability of timing will be gradually reduced. The aforesaid technical defect may get increasingly worse with the use of the product, and consequently, timing errors and malfunctions of the drive circuit would possibly occur. This is a weak link in the circuit.

According to the embodiment of the present disclosure, the reliability of operation timing can be guaranteed by disconnecting the discharge path of point Q before the voltage jump at point Q occurs, and at the time of the next jump at point Q (the jump from the high electric potential to the low electric potential), point Q will be in control of the voltage at point P once again. Thus, the working reliability of the whole GOA drive circuit can be improved, and the service life of the product can be prolonged.

According to one embodiment of the present disclosure, a same signal as a control signal of a control terminal of the pull-up control unit 21 can be used as the pre-pulldown signal Con. As shown in FIG. 3, a control signal $STn_1$ of the pull-up control unit 21 is an output signal $STn_1$ (a first transmission signal) of the transmission unit 26 in the previous stage of GOA drive unit in cascade connection with the present stage of GOA drive unit.

Figure 4:
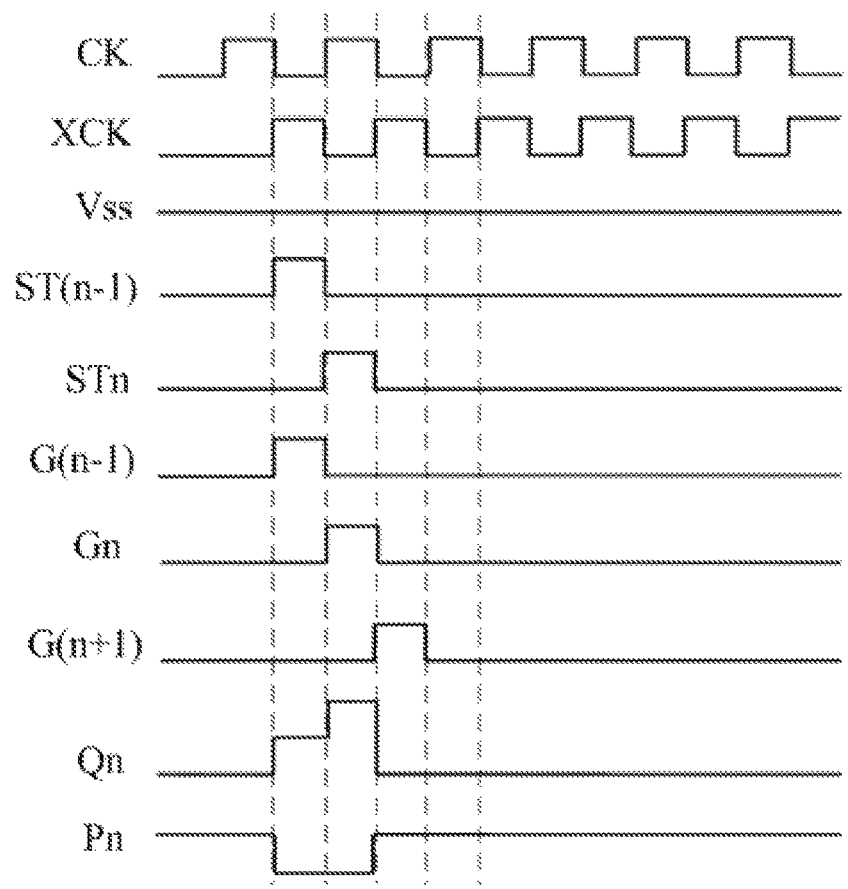
FIG. 4 is an operational timing diagram of a GOA drive circuit according to another embodiment of the present disclosure.

For example, if in the GOA drive circuit, the GOA drive units are in cascade connection with one another in sequence, a pre-pulldown signal Con of a $n^{th}$ stage of GOA drive unit is ST(n−1). The present embodiment will be further illustrated below with reference to the timing diagram as shown in FIG. 4.

The GOA drive circuit driven by two clock signals (2CK) is taken as an example. The clock signals CK and XCK are connected with the GOA drive units in each stage alternately, and the pull-up control unit 21 of the $n^{th}$ stage of GOA drive unit receives the transmission signal ST(n−1) generated by a $(n-1)^{th}$ stage of GOA drive unit. As shown in FIG. 4, the $(n-1)^{th}$ stage of GOA drive unit outputs the transmission signal ST(n−1) when XCK is in a high level. Under an action of ST(n−1), the transistor t11 and the transistor t61 are both turned on, and the voltage at point P is pulled down to a low electric potential. Under an action of the constant high voltage signal Vdd, the voltage at point Q jumps from a low electric potential to a high electric potential for a first time. Point Q is controlled by Vdd to achieve the corresponding preset electric potential, as shown in FIG. 4 of a first stepped rising edge of Qn.

In the following timing, CK changes to a high level. Affected by CK, the voltage at point Q jumps for the second time, as shown in FIG. 4 of a second stepped rising edge of Qn. Point P still remains at a low electric potential under a control of point Q. Output waveforms of signals such as STn, G(n−1) and Gn in FIG. 4 can be obtained according to the prior art, and will not be described herein.

According to other embodiments of the present disclosure, following signals can be used as the pre-pulldown signal Con. In a further previous stage of GOA drive unit of a previous stage of GOA drive unit which is in cascade connection with a present stage of GOA drive unit, the transmission unit 26 outputs a transmission signal $ST(n_1-1)$ (a second transmission signal) which serves as the pre-pulldown signal Con.

For example, if in the GOA drive circuit, the GOA drive units are in cascade connection with one another in sequence, the pre-pulldown signal Con of the $n^{th}$ stage GOA drive unit is ST(n−2). In this case, it should be ensured that the rising edge of ST(n−2) is ahead of the rising edge of Q, and the falling edge of ST(n−2) is ahead of the falling edge of Q while lags behind the rising edge of Q. The GOA drive circuit driven by two clock signals (2CK) is still taken as an example. As shown in FIG. 4, the above condition can be met if there is an overlapped part of a certain width between the high levels of the CK clock signal and the XCK clock signal, i.e., the falling edge of the CK clock signal lags behind the rising edge of the XCK clock signal.

In addition, it should be noted that, the above described GOA drive circuit with a 2CK driving mode is used only for explaining the embodiments of the present disclosure, rather than limiting the present disclosure. Actually, the GOA drive circuit according to the embodiment of the present disclosure can be applied to a variety of operating modes. For example, when the circuit is driven by an 8CK mode, CK is connected with CK1, CK3, CK5 and CK7 in sequence, and XCK is connected with CK2, CK4, CK6 and CK8 in sequence. All GOA drive units are divided into four groups. As to a $n^{th}$ stage of GOA drive unit, a transmission signal ST(n−4) corresponding to a $(n-4)^{th}$ stage of GOA drive circuit can be used as the pre-pulldown signal, and a transmission signal ST(n−5) corresponding to a $(n-5)^{th}$ stage GOA drive circuit can also be used as the pre-pulldown signal. It can be understood that, in the latter case, there should be an overlapped part of a certain width between the high levels of the clock signals. Those skilled in the art can select the operating mode of the GOA drive circuit as necessary (and not explained herein).

In the GOA drive unit according to the embodiment of the present disclosure, a pre-pulldown unit is provided so that the discharge path of the voltage at point Q is disconnected before the voltage at point Q jumps from a low electric potential to a high electric potential, thereby ensuring the stability of the critical node voltages in the circuit as well as the reliability of timing. Thus, the GOA drive circuit overall performance can be enhanced, and the service life of liquid crystal display device can be prolonged.

The above embodiments are described only for better understanding, rather than restricting the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A GOA drive circuit, comprising multiple stages of GOA drive units, wherein a GOA drive unit in each stage is used for outputting a row scan signal to a row of pixel units;
   wherein the GOA drive unit includes a pull-up unit, a pull-up control unit, a transmission unit, a pull-down unit, and a pull-down sustaining unit, the pull-up control unit outputting a first voltage signal; and
   wherein the GOA drive unit further includes a pre-pull down unit, which is configured to disconnect a discharge path of the first voltage signal via the pull-down sustaining unit before the first voltage signal jumps from a low electric potential to a high electric potential,
   wherein the pull-down sustaining unit comprises a first transistor, with a gate thereof being connected with the first voltage signal, a source thereof being connected with a first power signal, and a drain thereof outputting a second voltage signal which is configured to connect or disconnect the path,
   wherein the pre-pulldown unit comprises a second transistor, with a source thereof being connected with the first power signal, a drain thereof being connected with the second voltage signal, and a gate thereof being connected with a pre-pulldown signal; and
   wherein a rising edge of the pre-pulldown signal goes ahead of a rising edge of the first voltage signal, and a falling edge of the pre-pulldown signal goes ahead of a falling edge of the first voltage signal while lags behind the rising edge of the first voltage signal.

2. The GOA drive circuit according to claim 1, wherein in a previous stage of GOA drive unit in cascade connection with a present stage of GOA drive unit, the transmission unit outputs a first transmission signal which serves as the pre-pulldown signal.

3. The GOA drive circuit according to claim 2, wherein the pull-up control unit comprises a third transistor, with a gate thereof being connected with the first transmission signal output by the transmission unit of the previous stage of GOA drive unit in cascade connection with the present stage of GOA drive unit, a source thereof being connected with the first voltage signal, and a drain thereof being connected with a second power signal.

4. The GOA drive circuit according to claim 2, wherein the pull-down sustaining unit further comprises:
   a fourth transistor, with a gate thereof being connected with the second voltage signal, a source thereof being connected with the first power signal, and a drain thereof being connected with the first voltage signal;
   a fifth transistor, with a gate and a source thereof being respectively connected to the gate and the source of the fourth transistor, and a drain thereof being connected with a row scan signal corresponding to a GOA drive unit to which the fifth transistor belongs; and
   a sixth transistor, with a gate and a drain thereof being both connected with a third power signal, and a source thereof being connected with the second voltage signal.

5. The GOA drive circuit according to claim 2, wherein the transmission unit comprises a seventh transistor, with a gate thereof being connected with the first voltage signal, a drain thereof being connected with a clock signal, and a source thereof outputting a third transmission signal.

6. The GOA drive circuit according to claim 2, wherein the pull-up unit comprises:
   an eighth transistor, with a gate thereof being connected with the first voltage signal, a drain thereof being connected with a clock signal, and a source thereof outputting a row scan signal corresponding to a GOA drive unit to which the eighth transistor belongs; and
   a bootstrap capacitor, in parallel connection between the gate and the source of the eighth transistor.

7. The GOA drive circuit according to claim 2, wherein the pull-down unit comprises a ninth transistor and a tenth transistor, with a gate and a source of the ninth transistor being respectively connected with a gate and a source of the tenth transistor, a drain of the ninth transistor being connected with the first voltage signal, and a drain of the tenth transistor being connected with a row scan signal corresponding to a GOA drive unit to which the tenth transistor belongs.

8. The GOA drive circuit according to claim 1, wherein in a further previous stage of GOA drive unit of a previous stage of GOA drive unit which is in cascade connection with a present stage of GOA drive unit, the transmission unit outputs a second transmission signal which serves as the precharge pull-down signal.

9. The GOA drive circuit according to claim 8, wherein the pull-up control unit comprises a third transistor, with a gate thereof being connected with the first transmission signal output by the transmission unit of the previous stage of GOA drive unit in cascade connection with the present stage GOA drive unit, a source thereof being connected with the first voltage signal, and a drain thereof being connected with a second power signal.

10. The GOA drive circuit according to claim 8, wherein the pull-down sustaining unit further comprises:
   a fourth transistor, with a gate thereof being connected with the second voltage signal, a source thereof being connected with the first power signal, and a drain thereof being connected with the first voltage signal;
   a fifth transistor, with a gate and a source thereof being respectively connected to the gate and the source of the fourth transistor, and a drain thereof being connected with a row scan signal corresponding to a GOA drive unit to which the fifth transistor belongs; and
   a sixth transistor, with a gate and a drain thereof being both connected with a third power signal, and a source thereof being connected with the second voltage signal.

11. The GOA drive circuit according to claim 8, wherein the transmission unit comprises a seventh transistor, with a gate thereof being connected with the first voltage signal, a drain thereof being connected with a clock signal, and a source thereof outputting a third transmission signal.

12. The GOA drive circuit according to claim 8, wherein the pull-up unit comprises:
   an eighth transistor, with a gate thereof being connected with the first voltage signal, a drain thereof being connected with a clock signal, and a source thereof outputting a row scan signal corresponding to a GOA drive unit to which the eighth transistor belongs; and
   a bootstrap capacitor, in parallel connection between the gate and the source of the eighth transistor.

13. The GOA drive circuit according to claim 8, wherein the pull-down unit comprises a ninth transistor and a tenth transistor, with a gate and a source of the ninth transistor being respectively connected with a gate and a source of the tenth transistor, a drain of the ninth transistor being connected with the first voltage signal, and a drain of the tenth transistor being connected with a row scan signal corresponding to a GOA drive unit to which the tenth transistor belongs.

\* \* \* \* \*